US009318876B1

(12) United States Patent
Li (10) Patent No.: US 9,318,876 B1
(45) Date of Patent: Apr. 19, 2016

(54) ARRANGEMENT OF MULTIPLE DIODE LASER MODULE AND METHOD FOR OPERATING THE SAME

(71) Applicant: TRUMPF PHOTONICS, INC, Cranbury, NJ (US)

(72) Inventor: Yufeng Li, Plainsboro, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 14/602,418

(22) Filed: Jan. 22, 2015

(51) Int. Cl.
*G02B 6/26* (2006.01)
*H01S 5/40* (2006.01)
*H01S 5/125* (2006.01)
*H01S 5/022* (2006.01)
*G02B 6/42* (2006.01)

(52) U.S. Cl.
CPC .............. *H01S 5/4012* (2013.01); *G02B 6/423* (2013.01); *G02B 6/4214* (2013.01); *H01S 5/02284* (2013.01); *H01S 5/125* (2013.01); *H01S 5/4018* (2013.01); *H01S 5/4031* (2013.01)

(58) Field of Classification Search
CPC .......... G02B 6/4214; G02B 6/32; G02B 6/43; G02B 6/4246; G02B 6/12007; G02B 6/26
USPC ................................................ 385/15, 31, 39
See application file for complete search history.

(56) References Cited

U.S. PATENT DOCUMENTS

| 6,163,552 | A  | * | 12/2000 | Engelberth  | H01S 3/302 372/102 |
| 6,373,868 | B1 | * | 4/2002  | Zhang       | H01S 3/109 372/19  |
| 7,751,458 | B2 |   | 7/2010  | Regaard et al. | |
| 7,801,190 | B2 |   | 9/2010  | Lorenzen et al. | |
| 8,432,945 | B2 |   | 4/2013  | Faybishenko | |
| 8,437,086 | B2 |   | 5/2013  | Du et al.   | |
| 9,065,237 | B2 |   | 6/2015  | Guo et al.  | |
| 2015/0131692 | A1 |   | 5/2015  | Hayamizu et al. | |

\* cited by examiner

Primary Examiner — Jennifer Doan
(74) Attorney, Agent, or Firm — Graham Curtin, P.A.

(57) ABSTRACT

Apparatus and methods are provided for a laser module with a base including stepped platforms with an offset relative to an adjacent platform, each stepped platform accommodating a laser source. The module has at least a first plurality of stepped platforms and a second plurality of stepped platforms. Each platform accommodates a laser source that is part of a plurality of laser sources. The plurality of laser sources is arranged in a single plane to have each laser source emit laser radiation in the same direction that is perpendicular to the single plane. Laser radiation generated by the laser sources associated with the first plurality of platforms is combined into a first combined beam of laser radiation and the laser radiation generated by the laser sources associated with the second plurality of platforms is combined into a second combined beam of laser radiation. The first and second combined beam of laser radiation are combined by an optical combiner and coupled into an optical fiber.

22 Claims, 11 Drawing Sheets

ARRANGEMENT OF MULTIPLE DIODE LASER MODULE AND METHOD FOR OPERATING THE SAME

BACKGROUND OF THE INVENTION

The present invention relates generally to multi-emitter laser modules with optionally an integrated cooling system.

Single semiconductor lasers or emitters are compact and are widely used in a wide range of applications. In some applications an optical output power is required that is significantly greater than the output of a single emitter. One solution is to create a module with a plurality of single emitters and to combine the optical output of the individual single emitters into a combined optical output. The term single emitter is used herein. An example of a single emitter is for instance the L4 diode laser module by JDS Uniphase Corporation. However, a source of laser radiation can also be a stack or an array or bar of semiconductor lasers or a plurality of laser diodes. An example of a laser bar is the TruDiode 301 by TRUMPF. Both the single emitter, which is a single laser diode, and a stack or bar of laser diodes or a plurality of laser diodes will be considered herein to be a single laser source, unless specifically identified differently.

Multiple laser sources can typically be assembled in a module such that the individual beams of the single sources are optically stacked in one axis to generate a single beam of laser radiation with a much higher optical power level than from the single laser source. Polarization and wavelength combining are often used in addition to optical stacking to further increase the optical power and brightness. There are different known ways to position individual laser sources in a module and combine the individual outputs into a more powerful combined optical output. See, for example, U.S. Pat. Nos. 7,801,190 and 8,611,389.

Figure 1:
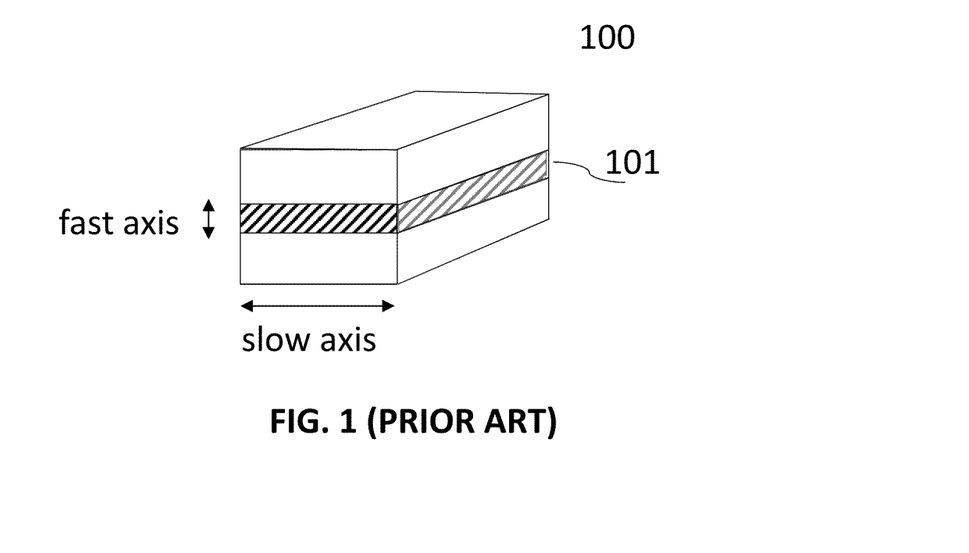
FIGS. 1 and 2 illustrate in diagram a structure of a laser diode.

Edge emitting laser diodes are known in the art. For illustrative purposes a diagram of such a laser diode 100 is provided in FIG. 1. The diode contains multiple layers, including P and N layers and a radiating layer 101, generally with a long body and a smaller facing side. The identified aperture or facet of the layer 101 is the radiating part of interest of the device 100. Generally, the emitting apertures of a laser diode are rectangular in shape with the long dimension having a size of typically tens to hundreds of microns, while the short dimension is typically one to two micron in size. Diffraction effects cause the emerging radiation to diverge, with the divergence angle being inversely proportional to the size of the aperture. The short dimension of the aperture s comparable to the typical laser diode wavelength of approximately one micron; diffraction effects result in large beam divergence in this, the "fast axis", direction which may be as high as seventy five degrees. The size of the divergence angle is known as the numerical aperture (NA), the beam having a lower numerical aperture along the direction of the stripe than perpendicular to the stripe. The long dimension of the stripe is known as the slow axis of the laser diode.

Collimating lenses are applied to correct for the divergence of the radiation in the direction of the fast axis and the slow axis. In general, the fast axis collimators are placed directly or close to the output of the laser and may be cylindrical or toroidal in shape. At a further distance than the fast axis collimators, a slow axis collimator is applied to each laser source. Accordingly, the output beams of the individual laser sources are typically all collimated before being combined. The collimated individual source beams then have to be combined with an optical combiner into a single output beam, by for instance an optical multiplexer or by a polarizer.

In order to be able to properly collimate the individual beams and properly align the beams to enable combining, the individual laser sources have to be arranged and aligned with optics to keep individual beams separate and limit cross talk and interference of individual beams before the combining step.

The related art provides several approaches to the creation of a combined laser beam in a laser module using single emitters. U.S. Pat. No. 8,437,086 issued on May 7, 2013 to Du et al. and which is incorporated herein by reference in its entirety, shows several approaches and configurations of carriers, integration and lay-out of optics and devices. It also demonstrates some of the issues inherent in the approaches taken. The apparatus that contains the individual single emitters and combines them into a single optical output will be called a multiple laser module or just module.

Accordingly, improved and novel multi-single laser emitter modules with cost effective architectures and housings, are needed.

SUMMARY OF THE INVENTION

Aspects of the present invention provide systems and methods to combine radiation from a plurality of aligned laser sources, such as emitter diodes, to increase the optical power that can be coupled into an optical fiber.

In accordance with one aspect of the invention, a laser module includes a base comprising a first and second plurality of stepped platforms and a plurality of laser sources, wherein one laser source is secured on each one of the first and second plurality of stepped platforms so that each of the plurality of laser sources is capable of emitting, and when in operation emits, radiation in a first direction. In one embodiment, the plurality of laser sources are aligned in a first common plane. Each laser source is capable of emitting radiation. The laser module, in accordance with this aspect of the invention, also includes a first plurality of reflectors, wherein one of the first plurality of reflectors is to receive radiation from the laser source located on the one of the first plurality of stepped platforms and to reflect radiation in a second direction. The second direction is in one embodiment perpendicular to the first direction. Each of the first plurality of reflectors are preferably located in their own common plane at a first distance from the common plane of the first plurality of laser sources.

The laser module, in accordance with this aspect of the invention, also includes a second plurality of reflectors, wherein one of the second plurality of reflectors is to receive radiation from the laser sources located on the one of the second plurality of stepped platforms and to reflect radiation in a third direction that is in one embodiment opposite the second direction. Each of the second plurality of reflectors are preferably located in their own common plane at a second distance from the common plane of the second plurality of laser sources. The third distance is greater than the second distance.

The laser module, in accordance with this aspect of the invention, also includes an optical combiner that combines the radiation of the first and second plurality of laser sources into a single beam that can be coupled into an optical fiber.

In accordance with another aspect of the invention, the plurality of laser sources are single emitter diode lasers.

In accordance with another aspect of the invention, the optical combiner is positioned in the laser module between the first plurality of stepped platforms and the second plurality of stepped platforms.

In accordance with another aspect of the invention, the base and a body of the laser module are machined from a single piece of metal.

Alternatively, the base and a body of the laser module are produced as a structurally integrated ceramic.

In accordance with another aspect of the invention, a volume Bragg grating is positioned in the laser module to receive radiation from the optical combiner.

In accordance with another aspect of the invention, a fast axis collimator and a slow axis collimator are secured in each of the first and second plurality of stepped platforms in a radiation path between the laser source and the reflector located in each of the first and second plurality of stepped platforms.

In accordance with another aspect of the invention, the stepped platforms can be arranged in a variety of ways. For example, the first plurality of stepped platforms can be stepped downward toward the second plurality of stepped platforms and the second plurality of stepped platforms can be stepped downward toward the first plurality of stepped platforms.

In accordance with another aspect of the invention, each of the first plurality of stepped platforms is offset from an adjacent platform in the first plurality of stepped platforms by a first predetermined step height and each of the second plurality of stepped platforms is offset from an adjacent platform in the second plurality of stepped platforms by a second predetermined step height.

The present invention also includes methods of combining radiation in a laser module. One embodiment of the method includes the steps of emitting radiation with a plurality of laser sources on first and second stepped platforms, each in a first direction, and then generating a first set of radiation by reflecting radiation from each of the plurality of lasers in the first stepped platform with a first plurality of reflectors located in a first common plane, in a second direction generally perpendicular to the first direction. Also, a second set of radiation is generated by reflecting radiation from each of the plurality of lasers in the second stepped platform with a second plurality of reflectors located in a second common plane, in a third direction that is generally opposite from the second direction, wherein the first and second common planes are different planes. A third set of radiation is generated by reflecting the first set of radiation with a reflector. Combined radiation is generated by combining the second set of radiation and the third set of radiation with a polarizer or wavelength combiner. The combined radiation is then coupled into an optical fiber. In a preferred embodiment of the method, the first and second plurality of laser sources are also aligned in a common plane, which is a different plane than the first and second common planes, and the common planes of the first and second plurality of reflectors are each located a different distance from the common plane of the plurality of laser sources.

In accordance with an aspect of the method the combined radiation is passed through a volume Bragg grating. Also, in accordance with another aspect of the invention, radiation from each of the plurality of laser sources is passed through a fast axis collimator and a slow axis collimator before being reflected by individual reflectors.

In another embodiment of the present invention, a laser module includes optical components to direct radiation from multiple lasers to an optical fiber. The front end of the optical fiber is bonded to an endcap, which is positionally secured to a structure in the platform. In accordance with one aspect of the present invention, the structure is a groove. In accordance with another aspect of the present invention, the groove is a v-groove. Other structures can also be used. For example, the endcap can also be secured to a post or a ∩-shaped clasp or to any structure that can securely hold the endcap. In accordance with an aspect of the invention, an epoxy coating is applied to the beginning section of the optical fiber to fix the fiber inside the housing. In accordance with another aspect of the invention, any fiber jacket is removed in this beginning section to expose the fiber cladding, and the refractive index of the epoxy coating is the same or greater than the refractive index of the fiber cladding, so that light coupled into fiber cladding can leak out and get absorbed. This fiber coupling arrangement can be used to arbitrary laser module architecture, but it fits particularly well with the module layouts described in other embodiments of the current invention.

Other advantages of the invention will be appreciated from the claims, the description and the drawings. The features which have been mentioned above and those which are set out in greater detail below can also be used individually or together in any combination. The embodiments which are shown and described are not intended to be understood to be a definitive listing, but instead are of exemplary character in order to describe the invention.

DETAILED DESCRIPTION

One aspect of the present invention is directed to a cost effective architecture and housing for single emitter modules resulting in a staircase-like arrangement of the single emitters optimized for optical stacking the radiation to achieve power and brightness increases into an optical fiber. In one embodiment of the present invention a laser module includes a base comprising a first and second plurality of stepped platforms, each of the first and second plurality of platforms hosting a laser source and a reflector wherein the reflector receives radiation from the laser source and reflects radiation. Each laser source in the first and second plurality of stepped platforms is aligned in a common plane; each reflector in the first plurality of platforms being aligned a first distance from the common plane, and each reflector in the second plurality of platforms being aligned a second distance from the common plane, wherein the second distance is greater than the first distance. The laser module includes a diverting reflector positioned that reflects radiation from the first plurality of mirrors to a polarizer or wavelength combiner that combines the radiation of the plurality of laser sources into a single beam that is coupled into an optical fiber.

Figure 2:
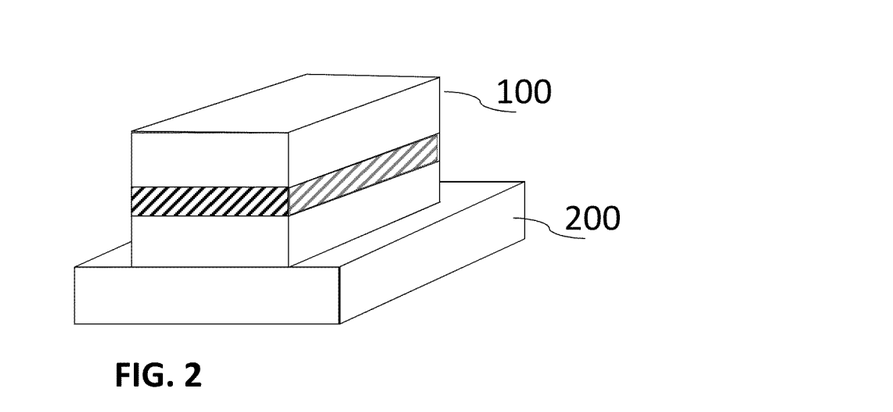

In accordance with an aspect of the present invention, the laser source is a high-power single emitter laser diode. A laser diode 100 on a sub-mount 200 is illustrated in FIG. 2. The sub-mount may be greater than the footprint of the laser source, it may also be equal or smaller. The present invention uses a plurality of laser diodes 100 stacked on a stepped platform.

Figure 3:
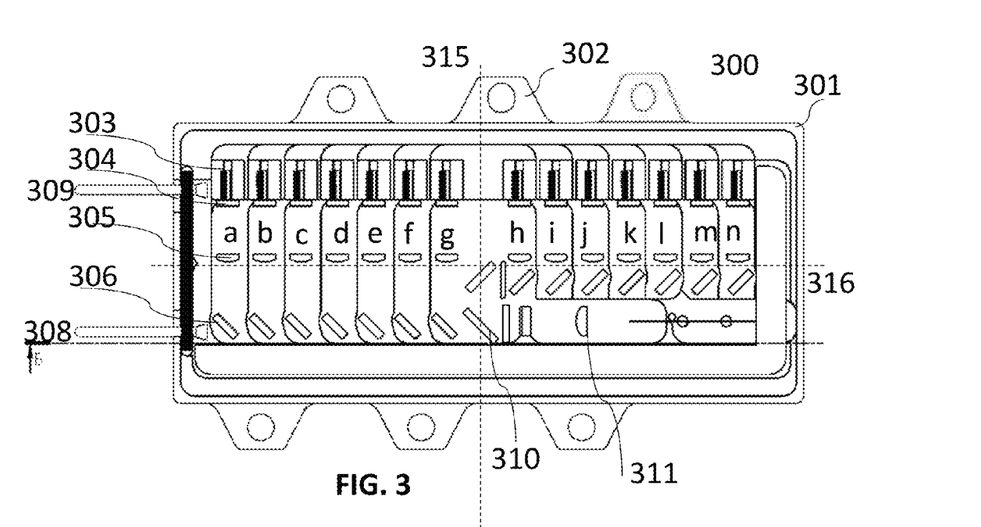
FIG. 3 illustrates in top view diagram a laser module in accordance with an aspect of the present invention.
Figure 4:
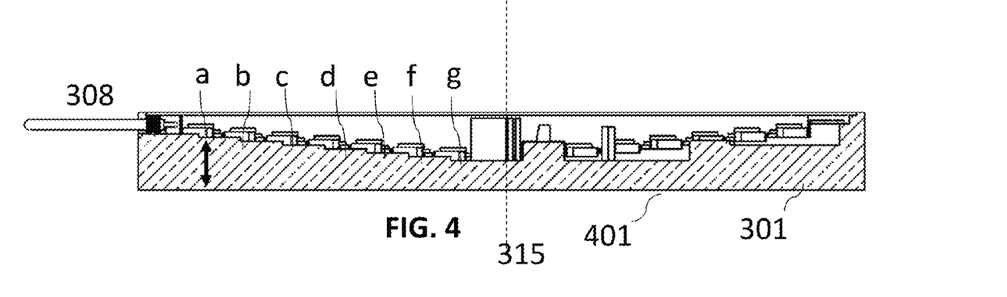
FIG. 4 illustrates in diagram a cross-section of a body of a laser module in accordance with an aspect of the present invention.
Figure 5:
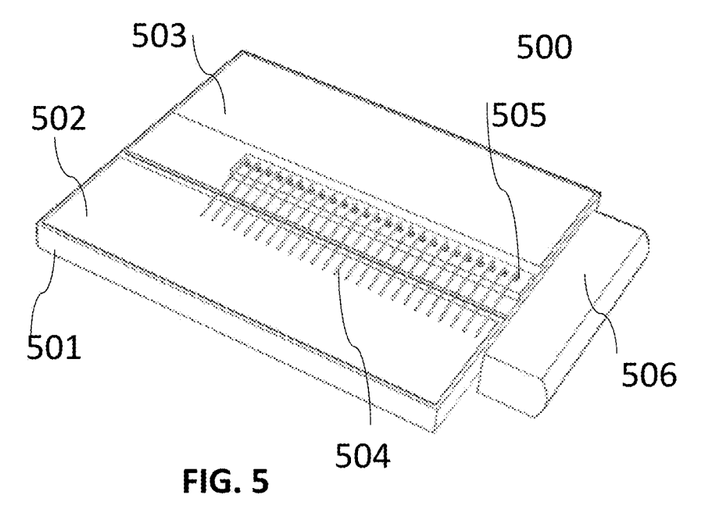
FIGS. 5 and 6 illustrate a laser emitter package on a submount in accordance with an aspect of the present invention.

One embodiment of a multi emitter module in accordance with an aspect of the present invention is illustrated in FIGS. 3, 4 and 5. The diagrams of FIGS. 3, 4 and 5 show the stepped lay-out of the module. FIG. 3 is a top view of a module 300. The module 300 has an integrated body 301, including the outside or frame of the body, including integrated flanges and connecting holes 302. The inside of the module contains the stepped structure, with steps or platforms a, b, c, d, e, f and g are provided in the left side of the module, as shown in the top view of FIG. 3. Steps or platforms h, i, j, k, l, m and n are provided in the right side of the module, as shown. A cross section of the module 300 is shown in FIG. 4 and should be advantageously considered and viewed in combination with FIG. 3 to explain its construction.

FIG. 4 illustrates that body 301, in one embodiment of the present invention, is a one piece body that is machined of a single piece of metal or is created as a single body of ceramics. In one embodiment of the present invention, the body 301 is a metal body, and all steps, corners, cavities, slots and other features can be created by machining a solid block of metal such as copper with a computer numerical control (CNC) machine. Features will be explained further below. In a further embodiment of the present invention, the body 301 is completely made of ceramic. This can be done, for instance, by creating different layers of ceramic material with features being cut out from each layers and all ceramic layers being stacked in an aligned way and kilned in a furnace or oven to create a single body 301. One advantage of the ceramic embodiment over the machined metal is a significant reduction in cost. Furthermore, the thermal conductivity of AN and BeO is very good and their thermal expansion is similar to gallium arsenide, a common material for high power laser diodes.

The laser module as provided in accordance with an aspect of the present invention has as a single subunit in a single plane or on a single platform, comprising a single laser emitter 303 on a sub-mount powered by an electric current and radiating through a fast axis collimator 304 and a slow axis collimator 305 onto a reflector 306. The collimator 305 and reflector 306 are located and secured on a step or platform a in the body. The step a has a predefined height relative to the base level g relative to the bottom level 401 of the body. The body 301 that has the base level and the stepped platform, in its totality is called the base. The base is provided with walls and attachment flanges like 302 that in its totality is named the body of the laser module. In this example, the left side of the module has 7 different steps down or platforms a, b, c, d, e, f and g going down from left to right from a highest level a to lowest level g. Each step, or platform has its own emitter, fast and slow collimators and reflector. Thus, radiation emitted from individual emitter 303 will pass through collimators 304 and 305 to hit and being reflected by reflector 306 into the direction along an optical axis towards combining optics 310 located on level or platform g. The combining optics 310 in one embodiment of the present invention is a plate or prism with polarizing coating; in another embodiment it can be a dichroic reflector to combine laser radiation with different wavelengths.

Platform b is stepped down from level or platform a. The emitter, collimators and reflector associated with platform b are located below those of platform a, relative to level g or base level 401. The reflector associated with platform b reflects the radiation of emitter associated with platform b to the combining optics 310 to the focusing lens 311 to focus on a receiving optical fiber, for instance. Because of the level difference between platforms a and b the radiation of the related emitters are parallel along an axis towards 310 but not interfering with each other, as the optical axis of the two beams are at different levels. The emitters and optics on platforms c, d, e, f and g operate in a similar manner in a non-interfering way. The driving electric current is guided through connectors 308 and 309.

The module 300 has a similar arrangement preferably in a mirror set-up on the right side of the module. This is illustrated as platforms h, i, j, k, l, m and n in FIG. 3 and in FIG. 4 which shows a cross-sectional view of the module through a portion of the module as shown in FIG. 3.

Figure 6:
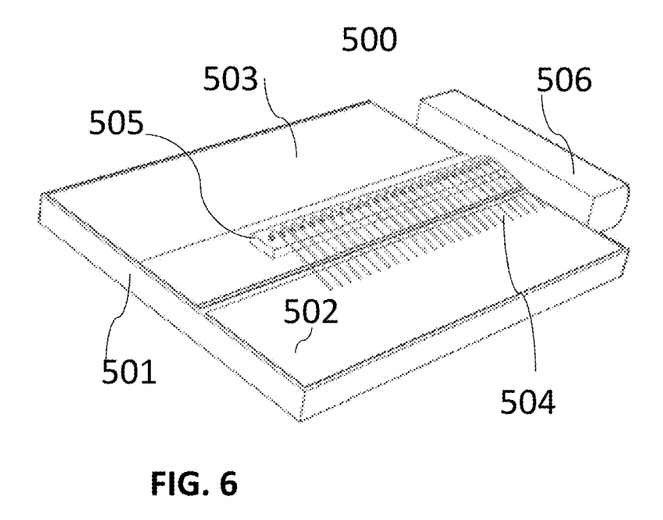
Figure 7:
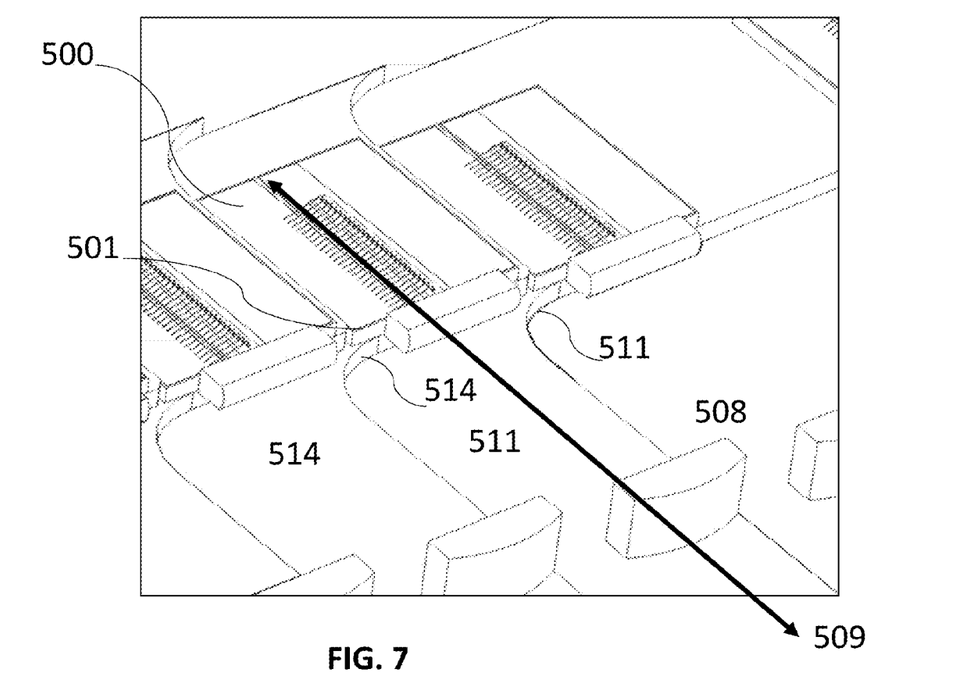
FIG. 7 illustrates in 3D diagram a laser source located on laser source mount part of a platform on a base of a body of a laser module in accordance with an aspect of the present invention.

Details of an emitter 500 are shown in FIGS. 5 and 6. A laser diode chip 505 is bonded onto a sub-mount 501, which may be a ceramic sub-mount, and which is then soldered onto the module base at a specific level. The top surface of the sub-mount is separated into two metalized regions 502, the N metallization, and 503, the P metallization layer, forming positive and negative contacts for the laser. Wirebonds 504 are used to connect the top of the laser diode (usually the N-side) to the negative contact area 502 of the sub-mount. A fast-axis collimator lens 506 is attached very close to the front facet of the laser due to the very small back focal length. FIG. 7 illustrates in a 3D diagram, an embodiment of a platform in accordance with an aspect of the present invention. A platform is at least the part of the module along which the laser radiation is guided to a reflector. The platform may or may not be level. Platforms are running parallel to each other. One platform is identified along the double arrow 509. This platform has an optical devices carrier section 511, which hosts the slow axis collimator 508 and a corresponding reflector, not shown. In one embodiment of the present invention, the emitter or emitter package on a sub-mount is placed preferably 0.5-2 mm above the surface of the optical devices carrier part 511. The platform section 510 may be higher than section 511. This section is called the laser source mount 510 part of the platform 509. Accordingly, a platform has an optical devices or optical components carrier part and a laser source mount part. Even, if these parts are not manufactured from a same part, they still are parts of a single platform. One may also say that the laser source mount part corresponds to or is associated with a specific platform as illustrated in FIG. 7.

Figure 8:
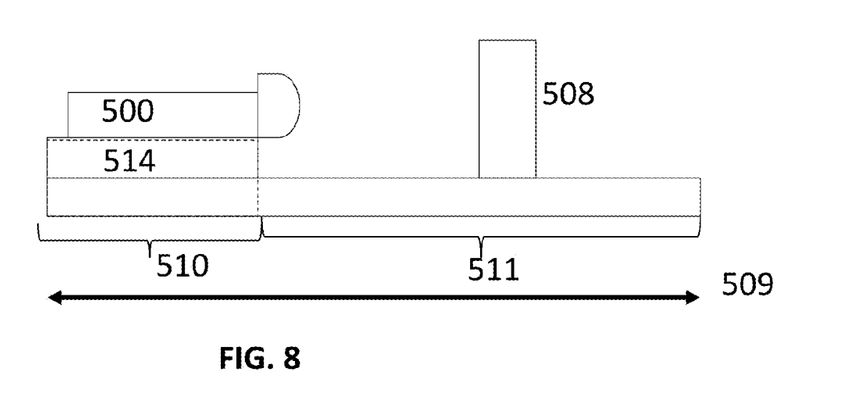
FIG. 8 illustrates in cross-sectional diagram a laser source located on a laser mount part of a platform in a laser module, in accordance with various aspects of the present invention.

A cross-sectional view of platform along 509 is illustrated in FIG. 8. It shows the emitter package 500 placed on a laser source mount portion 510, so that radiation emitted by package 500 sufficiently clears section 511 that is an optical component carrier part.

In one embodiment of the present invention, the body of the module is machined by for instance a CNC machine from a single piece of material such as copper or ceramic material. In another embodiment of the present invention, the body of the module is manufactured from layers of stacked materials. In that case it would be advantageous to limit the number of manufacturing steps. It would be preferable to have only layers of one thickness that are stacked. When the layers are made of ceramics that are kilned, the distinction between layers may disappear as the ceramic layers are bonded.

It is not required that the right side of the module is exactly mirrored, and in one embodiment of the current invention the steps on the left and the right side of the module are not exactly mirrored and are not on the same level. The mirroring of the left side of the module onto the right side takes place roughly around a virtual line 315 which is shown in FIGS. 3 and 4. It is noted that only the part of the module above the line 316 is mirrored in FIG. 3.

Figure 9:
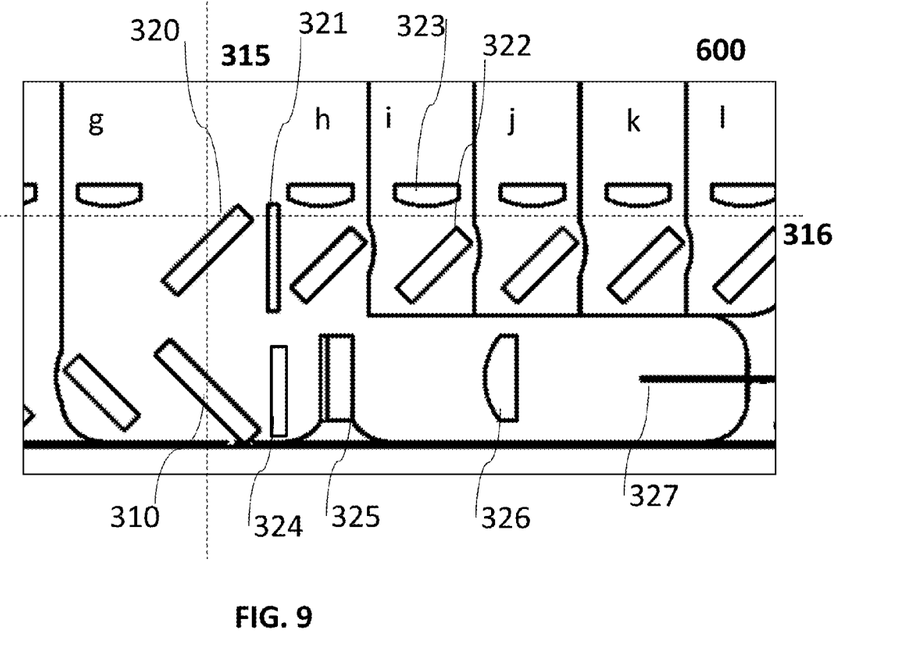
FIG. 9 illustrates in top view a section of a laser module in accordance with an aspect of the present invention.
Figure 10:
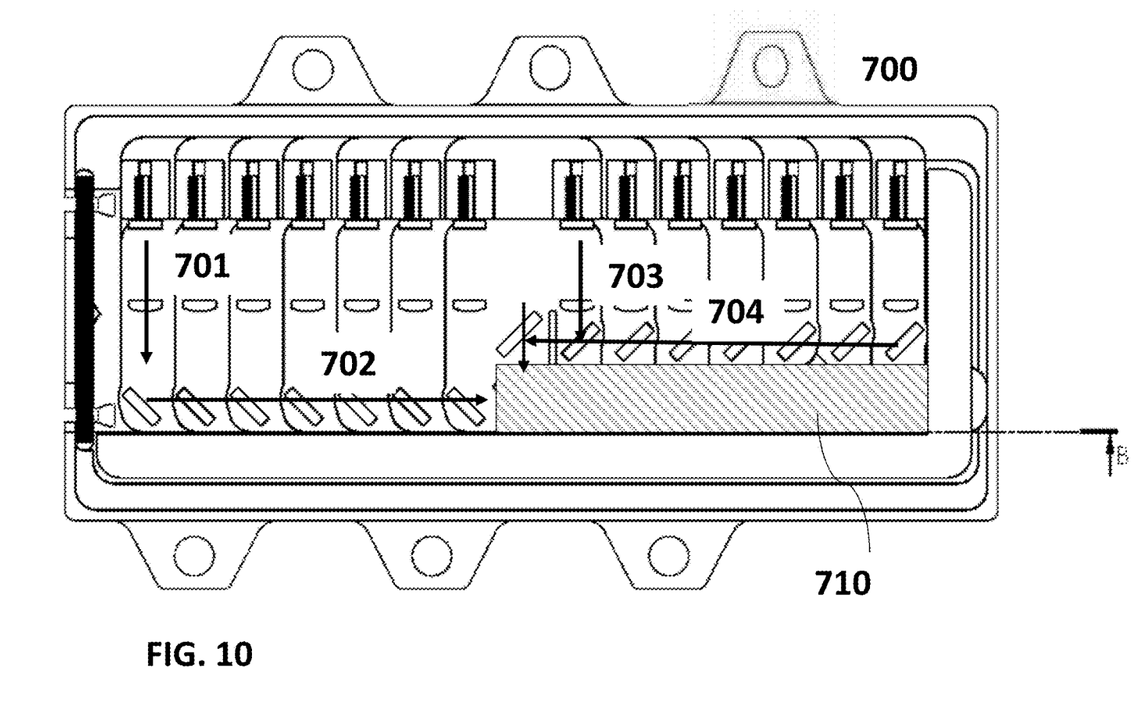
FIG. 10 illustrates in top view diagram a laser module in accordance with an aspect of the present invention.

A detailed illustration of the area 600 around combiner 310, which may be a polarization or polarizing combiner, is provided in FIG. 9. Other combiners such as wavelength multiplexers are also contemplated. The area to the right of line 315 and above line 316 is a mirror copy of the left side of module. It has the steps or platforms h, i, j, k, l, m and n. Step or level h is the same level as platform or level g. Each of the platforms h, i, j, k, l, m and n has a laser source, which may be a single laser emitter and a fast axis collimator (both not shown in FIG. 9) a slow axis collimator 323 and a reflector 322. To prevent FIG. 3 to become too crowded with numerals, some elements are not identified in FIG. 3, which are now identified in FIG. 9. This includes cylindrical lenses 325 and 326 to focus the combined beam into the output fiber 327. Furthermore, an optional volume Bragg grating 324 can be placed between the combining polarizer 310 and the cylindrical lens 325. The optional volume Bragg grating 324 is applied to stabilize the wavelength of the combined laser radiation.

Also identified in FIG. 9 is a half-wave plate 321 for the output beams of the laser sources on platforms or steps h, i, j, k, l, m and n in this illustrative example. The output beams of the emitters are reflected by a reflector 320 to the combining polarizer 310 and combined with the output of the emitters on the left side of the module. The individually collimated emitter or laser source beams from each side of the module are radiated along a common axis on the left side but separated by the stepped or staggered location of the sources and optics and are combined in the combining polarizer 310. The beams from the emitters or laser sources on the right side of the module are also radiating along a common axis but staggered due to the stepped platforms and are directed towards the combining polarizer 310 via the reflector 320. The space required for the reflector 320 and the combining polarizer 310 adds to the additional depth or width of the module beyond what would be required for a single row of stepped platforms with laser sources or emitters.

The herein provided configuration of a laser module having single rows of stepped or staggered emitters or laser sources, a row of reflectors and a second row of reflectors which are different distances from the row of emitters provides an extra benefit of creating room for the output optics or other output structures, such as a fiber coupling section.

Thus, one aspect of the present invention is that the laser sources are aligned in a row or in a common plane. In accordance with an aspect of the present invention, this means that the edges of the laser sources are aligned along a common plane. Alternatively, the alignment in a common plane can mean that the laser sources can be aligned such that any part of the plurality of laser sources can be aligned in a common plane. The plurality of reflectors in the first stepped platform are also located in a second common plane which is a first distance from the laser sources or from the first common plane. The plurality of reflectors in the second stepped platform are also located in a third common plane which is a second distance farther from the laser sources or from the first common plane.

This arrangement allows the fiber focusing lenses and a long section of optical fiber to be housed in the laser module next to the reflectors. This results in improved density of components and more effective cooling of the fiber inside the module space.

In accordance with one aspect of the invention, the first plurality of stepped platforms is stepped downward toward the second plurality of stepped platforms and the second plurality of stepped platforms is stepped downward toward the first plurality of stepped platforms. Each of the first plurality of stepped platforms can be offset from an adjacent platform in the first plurality of stepped platforms by a first predetermined step height and each of the second plurality of stepped platforms can be offset from an adjacent platform in the second plurality of stepped platforms by a second predetermined step height.

The required minimum distance between each emitter or laser source and slow axis collimator 323 determines the width or depth of the module. It is not desirable that radiation from emitters individually and radiation on one side of the module interferes with the radiation generated on another side of the module. Interference of radiation from individual emitters is prevented by using the stepped or staggered platforms. This is again illustrated in FIGS. 4, 7, 9, 10 and 11. Arrows 701 and 703 are exemplary indications of the axes and direction of the collimated radiation of the individual emitters. The radiation of the laser sources is parallel and in different planes, due to the platforms and the collimation and is pointed downwards in the module 700. The slow axis collimators are placed substantially in one plane, dictated by optical considerations. The individual beams are reflected by individual reflectors towards a combiner with (on right side of module) or without use (on left side of the module) of a common reflector. The common directions of the reflected individual beams are indicated by arrow 702 for the left side of the module and arrow 704 for the right side of the module. The reflected individual beams are substantially staggered within a single plane in the indicated common direction.

To prevent any possible interference or cross talk from the beams along arrows 702 and 704, these combined beams are placed in different planes, so the beams along arrow 704 cannot hit or reflect on any of the reflectors of combined beam along 702. This is achieved in this illustrative case by placing the row of reflectors of the right side of the module along the arrow 704 closer to the row of slow axis collimators than on the left side, which is clearly shown, though not necessarily in correct scale, in FIG. 10. By placing the reflectors on the right side of the module closer to the collimators than on the left side, room is created towards the bottom of the housing of the module for reflectors for the beams along 704 to be reflected by the reflector 320 in FIG. 9 towards the combining polarizer 310. This creates a free space 710 wherein combining optics and a fiber coupling section can be placed. This advantage makes the module, including its housing relatively compact and more robust compared to known multi-emitter modules with fiber outputs.

Also, it is easier to automate the assembly of the module, since all single-emitters are oriented in the same direction. This is especially true, if each of the plurality of laser sources are aligned along a common plane. Sufficient space is also available to place additional devices, such as the optional Bragg grating 324, into the module, without the need to extend the length of the module. This is different from multi-emitter modules that are available, for instance as described in the earlier cited U.S. Pat. No. 8,437,086.

The multi-emitter configurations of U.S. Pat. No. 8,437,086 illustrated in FIGS. 5A, 6A and 8A of that disclosure teach that the housing of the modules shown has to be extended beyond the position of the emitters in length to accommodate the common optics for the module. The configuration of the multi-emitter embodiment as provided in accordance with one or more aspects of the present invention provides the benefits of improved cooling of output fiber within similar module footprint, enabling the module to handle output power of 150 W and above.

The optical radiation of the individual single emitters of one row are each first collimated in fast axis resulting in a typical beam height (x axis) of 0.5 mm and subsequently collimated in slow axis (y axis) to result in a typical beam width of 2 mm. The individual, collimated beams are then optically stacked in fast axis (x axis) by reflectors redirecting the beam by preferably 90 degrees in the z-y plane. In one embodiment of the present invention the module has 2 rows of stacked single emitters arranged in one housing that are optically combined into one beam by polarization or wavelength multiplexing. It would be apparent to a person skilled in the art that other arrangements are possible, such as more than 2 rows of emitters and an arbitrary number of emitters in each row as well as an optical arrangement with interleaving beam paths of individual rows. Also aspects of the present invention are not limited to single emitters, but can comprise bars or mini-bars of laser diodes.

Figure 11:
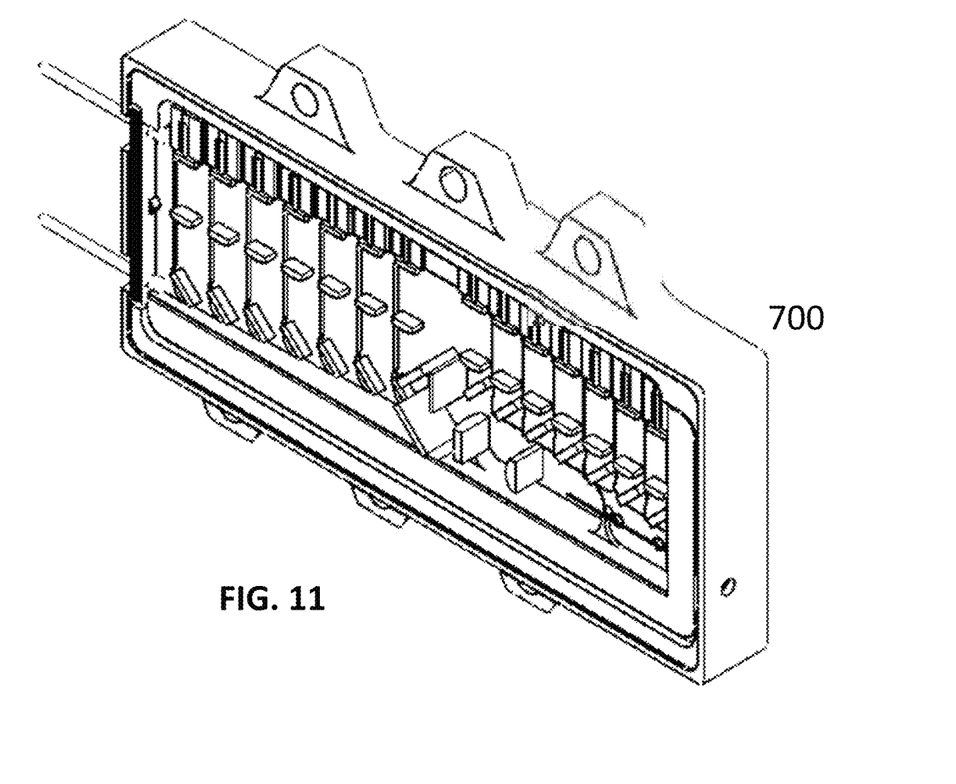
FIG. 11 illustrates in a 3D diagram a laser module in accordance with an aspect of the present invention.

The figures, such as FIG. 3, show a single emitter per platform module with two rows of single emitters, each comprising seven single emitters. The two rows are arranged along one side of the module, such that the optically stacked beams do not interfere and are polarization multiplexed prior to launching the beam into a fiber. FIG. 11 shows a 3D drawing of the module 700.

In accordance with an aspect of the invention, a method of combining radiation in a laser module is provided. First, radiation is emitted by a plurality of laser sources aligned in a common plane on first and second stepped platforms. A first set of radiation is generated by reflecting radiation from each of the plurality of lasers in the first stepped platform with a first plurality of reflectors located a first distance from the common plane, in a first direction. A second set of radiation is generated by reflecting radiation from each of the plurality of lasers in the second stepped platform with a second plurality of reflectors located a second distance from the common plane, in a second direction that is generally opposite from the first direction, wherein the second distance is greater than the first distance. Then a third set of radiation is generated by reflecting the first set of radiation with a reflector. Combined radiation is generated by combining the second set of radiation and the third set of radiation with a combiner into a single beam that is coupled into an optical fiber.

In accordance with other aspects of the method, the combined radiation from the combiner is passed through a volume Bragg grating. Also, the radiation from each of the plurality of laser sources is passed through a fast axis collimator and a slow axis collimator before being reflected by individual reflectors.

Figure 12:
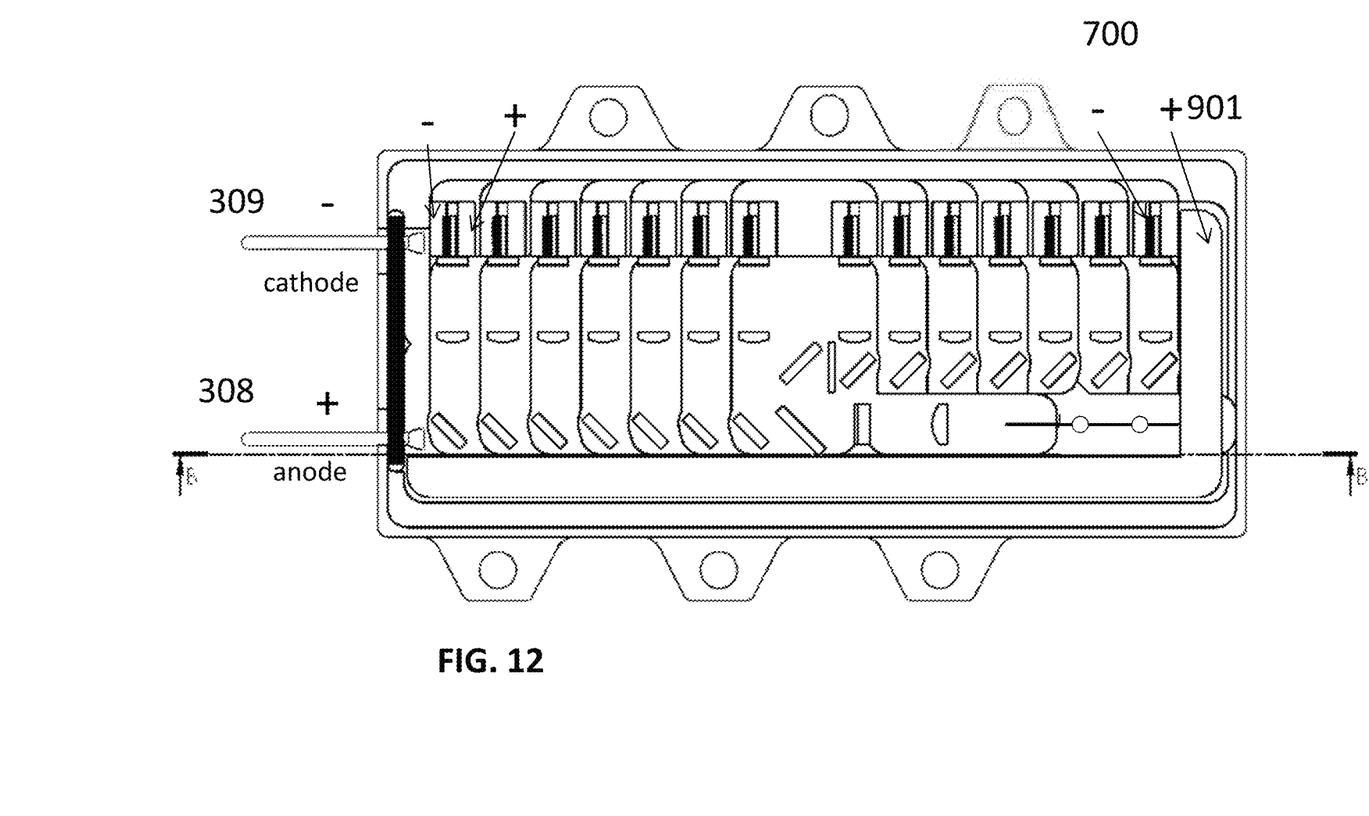
FIG. 12 illustrates in top view diagram electric connections in a laser module in accordance with an aspect of the present invention.

FIG. 12 illustrates the flow of current and the relative potentials inside the module via conductive layer 901.

A lay-out of a laser module as provided herein, in accordance with one or more aspects of the present invention, allows for a novel fiber coupling that increases the power provided by the laser module. The lay-out provides room for a fiber coupling that is placed inside a body of the laser module. This room was already identified in FIG. 10 as area 710 that is used for fiber coupling. Because of the novel lay-out, availability of area 710 is an unexpected but welcome benefit in an already compact design. A novel fiber coupling of laser radiation generated by components inside the body of the laser module to an exit fiber is provided in accordance with an aspect of the present invention. It is noted that in known laser module designs very limited room is available to perform the fiber coupling as described below. In those cases the exit power of a laser module is limited compared to the following fiber coupling provided in accordance with one or more aspects of the present invention. It is further noted that the fiber coupling provided herein in accordance with one or more aspects of the present invention can be used in any laser module that needs to couple laser radiation from the module to an external device or user. The fiber coupling design as provided herein is thus explicitly not limited to the stepped platform laser module, but can be used in different module designs that need to output laser radiation.

Figure 13:
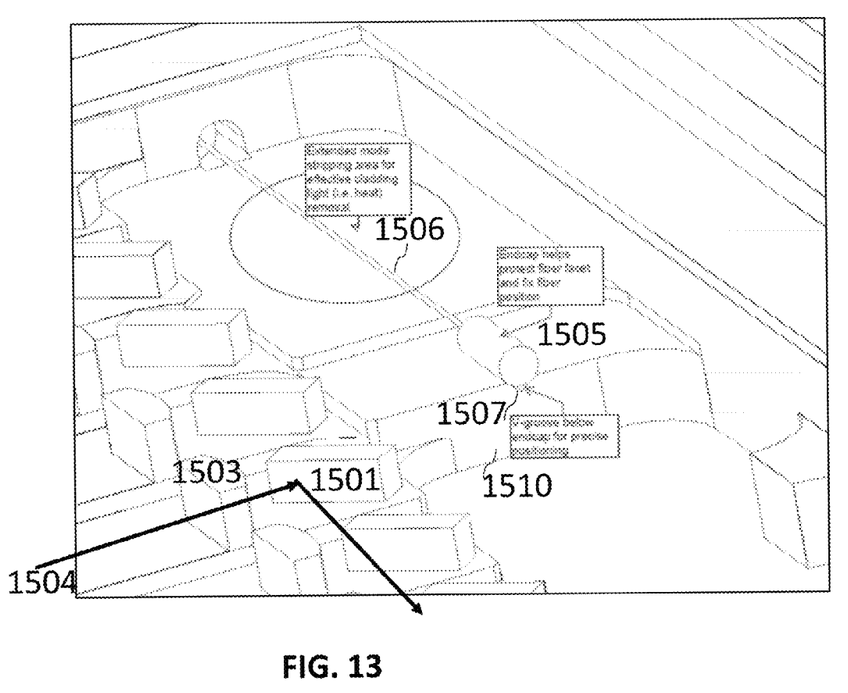
FIG. 13 illustrates a portion of a laser module in accordance with an aspect of the present invention.

FIG. 13 is a 3D illustration of the module around the area of the exit fiber 1506. It identifies a slow axis collimator 1503 and reflector 1501 and a beam 1504. The fiber 1506 has in one embodiment of the present invention a mode stripping area for effective cladding light removal inside the body of the laser module. The fiber at its entry point has an endcap 1505 that helps protect the fiber facet and to assist with fixing the fiber position. The endcap 1505 receives a focused beam of radiation and transmits the radiation down to the fiber 1506. The endcap 1505 sits in an indentation, which may be a groove in one embodiment, and which may be a v-groove 1507 in another embodiment to precisely position of the endcap. Any size v-groove may be applied that sets the endcap in a fixed position. The endcap in FIG. 13 is illustrated to be positioned on a platform that may be part of a base. The endcap may be fixed to any other structure that is fixed or can be fixed to a base or housing of the laser module as to securely hold the endcap. A structure attached to the platform can also be used to secure the endcap to the platform.

The cladding mode stripping may be achieved by applying a coating to the exit fiber 1506 with for instance an epoxy with a refractive index that is equal or higher that the refractive index of the cladding. Any fiber jacket outside the cladding layer is removed, so that the coating such as an epoxy coating surrounds the cladding of the fiber 1506, and the cladding surrounds the core of the fiber 1506. The refractive index of the epoxy is preferably not smaller than the index of the cladding, more preferably in a range of 1-5% higher than the index of the cladding and most preferably 5% or higher than the index of the cladding. The cladding may have an index of 1.45 and the epoxy has an index of 1.52. Preferably one coats the cladding of the exit fiber at least partially and preferably only a part of the fiber inside the housing or body of the laser module. It is intended that the stripped radiation power does not reach the connector outside the body of the laser module.

The cladding mode stripping dissipates power of radiation that was coupled into the cladding of the fiber instead of the core. The fiber is usually fixed to a connector outside the body of the laser module. Excess power in the cladding that is not removed may adversely affect the coupling system, for instance by burning up the fiber. When radiation escapes from fiber cladding and gets absorbed by the connector, the connector can heat up dramatically and fail. The above aspect of the present invention is advantageous in getting rid of cladding radiation before it exits the laser module. In accordance with an aspect of the present invention, at least 20 Watt of radiation power in the cladding can be removed by mode stripping inside the laser module, and removal of 30 Watt or more of radiation power in the cladding is also possible. Assuming a fiber coupling efficiency of 95% into the fiber core, the present invention can be used for laser modules with 500 W of output power or higher. In order to achieve a preferred level of cladding mode stripping, a minimum of 5-10 mm of exit fiber is coated with the epoxy and preferably between 10-20 mm of exit fiber is coated with the epoxy inside the body of the laser module.

Experimentation showed that when the fiber is fixed only with epoxy coating, the heating up of epoxy during operation may cause the fiber to move relative to the lens from which the radiation is coupled into the fiber facet, causing misalignment of the fiber facet. Several aspects of the present invention are provided to stabilize this fiber entry point. An endcap is 1505 is fused to the entry facet of the fiber. The endcap is preferably a fused silica glass cylinder, and the entry facet of the endcap is preferably anti-reflection (AR) coated to improve the fiber coupling efficiency. The dimensions of the endcap cylinder are preferably designed to accommodate the Numercial Aperture (NA) of the fiber. In one embodiment of the present invention, the endcap has a length of 3 mm and a diameter of 1 mm for an optical fiber with 0.22 NA. The axis of the cylinder is preferably aligned with the axis of the fiber. The larger diameter of the endcap compared to the fiber diameter allows for conveniently applying an AR coating to the entry side of the endcap, which would be much harder to apply to the significantly smaller fiber entry facet.

In accordance with an aspect of the present invention, a platform 1510 is provided to support or host at least the endcap 1505. To further stabilize the endcap, a v-groove is provided in the platform 1510 to receive and settle the endcap. Preferably, the epoxy covers the exit fiber starting at a distance from the endcap, preferably at least 1 mm away from the fuse between the fiber and the endcap. This creates a stable and aligned fiber coupling that strips cladding radiation and is not sensitive in alignment to the dissipation heat.

Note that the secured endcap and expoxy coated fiber optic embodiments described herein can be used on any type of laser emitter module architecture. However, due to the long path length available from the optical combiner to the fiber exit port, the fiber coupling embodiments here fit particularly well to the laser module architecture according to other aspects of the present invention.

Figure 14:
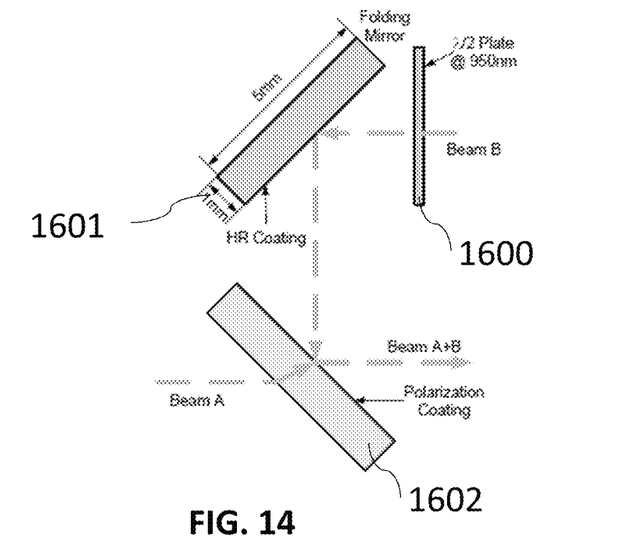
FIGS. 14, 15 and 16 illustrate beam combiners in accordance with various aspects of the present invention.
Figure 15:
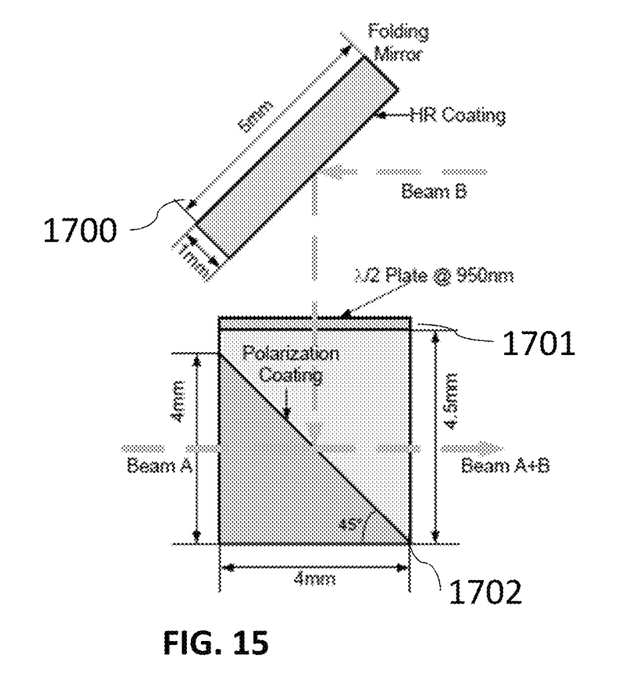
Figure 16:
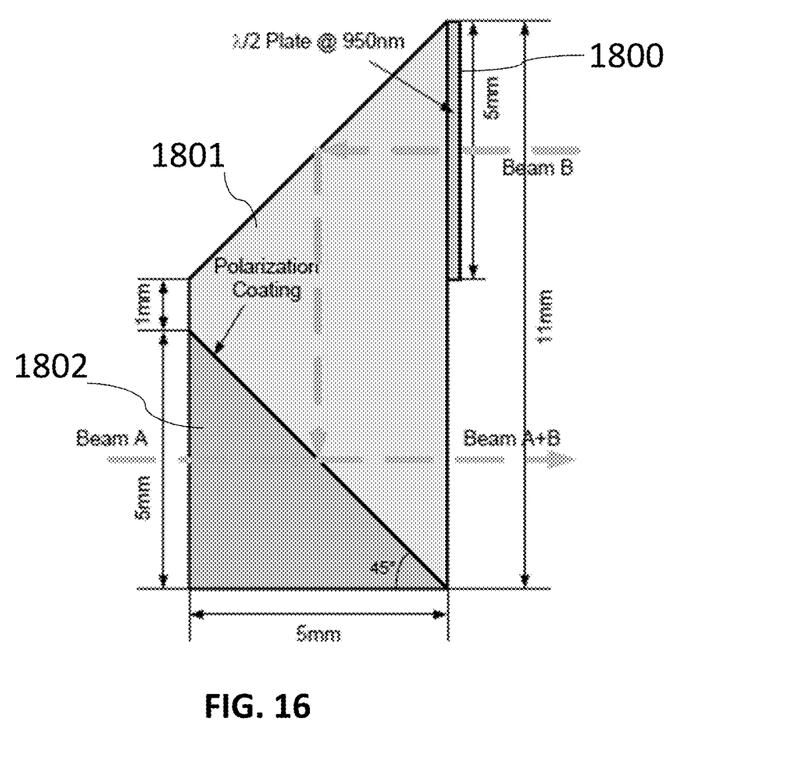

FIGS. 14, 15 and 16 illustrate several embodiments of polarization combining devices in the present invention to combine the radiation generated by the different laser sources. FIG. 14 illustrates an embodiment of the present invention for waveplate 1600 with mirror 1601 plus polarizer plate 1602. The advantage of this embodiment is that this is a very flexible embodiment with no glue interface. A disadvantage is that precise alignments for individual optics are needed.

FIG. 15 illustrates an embodiment of a combiner with a mirror 1700 with a polarization prism 1702. The polarization prism also has a waveplate 1701. The mirror 1700 can be aligned to correct beam offsets and the prism 1702 needs no alignment. A disadvantage may be that there are two glue interfaces. FIG. 16 illustrates an embodiment of an integrated combiner with a waveplate 1800 and two prism parts 1801 and 1802. An advantage of this embodiment is that it is a one piece design with minimal alignment requirements. A disadvantage of this embodiment may be that there is only partial beam correction by alignment, and that there are two glue interfaces.

The combiners of FIGS. 14, 15 and 16 are illustrative examples of beam combiners and other embodiments are possible.

While there have been shown, described and pointed out fundamental novel features of the invention as applied to preferred embodiments thereof, it will be understood that various omissions and substitutions and changes in the form and details of the methods and systems illustrated and in its operation may be made by those skilled in the art without departing from the spirit of the invention. It is the intention, therefore, to be limited only as indicated by the scope of the claims.

The invention claimed is:

1. A laser module, comprising:
a base comprising a first and second plurality of stepped platforms;
a plurality of laser sources, wherein only one laser source is secured on each one of the first and second plurality of stepped platforms, each of the plurality of laser sources capable of emitting radiation in a first direction;
a first plurality of reflectors, wherein one of the first plurality of reflectors is secured to one of the first plurality of stepped platforms to receive radiation from the laser source located on the one of the first plurality of stepped platforms and to reflect radiation in a second direction, wherein each of the first plurality of reflectors is located in a first plane;
a second plurality of reflectors, wherein one of the second plurality of reflectors is secured on one of the second plurality of stepped platforms to receive radiation from the laser source located on the one of the second plurality of stepped platforms and to reflect radiation in a third direction that is generally opposite the second direction, wherein each of the second plurality of reflectors is located in a second plane, the second plane being a greater distance from the plurality of laser sources than the first plane; and
an optical combiner that combines the radiation of the plurality of laser sources into a single beam that is inputted on an optical fiber.

2. The laser module of claim 1, wherein the plurality of laser sources are single emitter diode lasers.

3. The laser module of claim 1, wherein the optical combiner is positioned in the laser module between the first plurality of stepped platforms and the second plurality of stepped platforms.

4. The laser module of claim 1, wherein the base and a body of the laser module are machined from a single piece of metal.

5. The laser module of claim 1, wherein the base and a body of the laser module are produced as a structurally integrated ceramic.

6. The laser module of claim 1, further comprising a volume Bragg grating positioned in the laser module to receive radiation from the optical combiner.

7. The laser module of claim 1, further comprising a fast axis collimator and a slow axis collimator secured in each of the first and second plurality of stepped platforms in a radiation path between the laser source and the reflector located in each of the first and second plurality of stepped platforms.

8. The laser module of claim 1, wherein the first plurality of stepped platforms is stepped downward toward the second plurality of stepped platforms and wherein the second plurality of stepped platforms is stepped downward toward the first plurality of stepped platforms.

9. The laser module of claim 1, wherein each of the plurality of laser sources is aligned in a third plane.

10. The laser module of claim 1, wherein each of the first plurality of stepped platforms is offset from an adjacent platform in the first plurality of stepped platforms by a first predetermined step height and wherein each of the second plurality of stepped platforms is offset from an adjacent platform in the second plurality of stepped platforms by a second predetermined step height.

11. The laser module of claim 1, wherein the first plurality of stepped platforms is stepped downward in one direction and the second plurality of stepped platforms is stepped downward in an opposite direction.

12. A laser module, comprising:
a base comprising a first and second plurality of stepped platforms, each of the first and second plurality of platforms hosting a laser source and a reflector wherein the reflector receives radiation from the laser source and reflects radiation, wherein the laser source in each of the first and second plurality of platforms emits radiation in a first direction;
each reflector in the first plurality of platforms being aligned in a first plane, and each reflector in the second plurality of platforms being aligned in a second plane, wherein the first and second plane are different planes and the second plane is a greater distance from each of the laser sources than the first plane; and
an optical combiner that combines the radiation of the plurality of laser sources into a single beam that is inputted into an optical fiber.

13. A method of combining radiation in a laser module, comprising:
emitting radiation with a plurality of laser sources on first and second stepped platforms, each of the plurality of laser sources radiating in a first direction;
generating a first set of radiation beams by reflecting radiation from each of the plurality of laser sources associated with the first stepped platforms with a first plurality of reflectors of which each is located in a first plane, in a second direction perpendicular to the first direction;
generating a second set of radiation beams by reflecting radiation from each of the plurality of lasers in the second stepped platform with a second plurality of reflectors located in a second plane, in a third direction that is generally opposite from the second direction;
generating a third set of radiation beams by reflecting the first set of radiation beams with a reflector;
generating combined radiation by combining the second set of radiation beams and the third set of radiation with a combiner into a single beam that is inputted into an optical fiber.

14. The method of claim 13, wherein the plurality of laser sources are single emitter diode lasers.

15. The method of claim 13, further comprising passing the combined radiation through a volume Bragg grating.

16. The method of claim 13, further comprising passing radiation from each of the plurality of laser sources through a fast axis collimator and a slow axis collimator before reflecting the radiation from each of the plurality of laser sources.

17. The method of claim 13, wherein the first plurality of stepped platforms is stepped downward toward the second plurality of stepped platforms and wherein the second plurality of stepped platforms is stepped downward toward the first plurality of stepped platforms.

18. The method of claim 13, wherein each of the plurality of laser sources is aligned in a third plane.

19. The method of claim 13, wherein the optical combiner is located in the second plane.

20. A laser module, comprising:
a housing having a platform;
one or more laser sources secured to the platform;
optical components to direct radiation from the one or more lasers to an endcap, the endcap being positionally secured to a structure in the platform;
an optical fiber secured inside the housing to the endcap;
an epoxy coating applied to a cladding of the optical fiber inside the housing, wherein a refractive index of the coating is the same or greater than a refractive index of the cladding.

21. The laser module of claim 20, wherein the structure is a groove in the platform.

22. The laser module of claim 21, wherein the groove is a v-groove.

* * * * *